United States Patent [19]

Backes

[11] Patent Number: 4,569,031
[45] Date of Patent: Feb. 4, 1986

[54] CIRCUIT ARRANGEMENT FOR SERIAL DIGITAL FILTERS

[75] Inventor: Reiner Backes, Freiburg-Tiengen, Fed. Rep. of Germany

[73] Assignee: ITT Industries, Inc., New York, N.Y.

[21] Appl. No.: 477,576

[22] Filed: Mar. 21, 1983
(Under 37 CFR 1.47)

[30] Foreign Application Priority Data

Apr. 3, 1982 [EP] European Pat. Off. .......... 8271002.7

[51] Int. Cl.⁴ ............................................. G06F 7/38
[52] U.S. Cl. ................................................. 364/724
[58] Field of Search .................. 364/724; 375/103; 328/152; 333/166–167

[56] References Cited

U.S. PATENT DOCUMENTS

| | | | |
|---|---|---|---|
| 3,633,014 | 1/1972 | Lemp, Jr. et al. | 364/724 |
| 3,704,364 | 11/1972 | Roeschlein et al. | 364/724 |
| 4,087,754 | 5/1978 | Song | 375/94 |
| 4,366,547 | 12/1982 | Muller | 364/724 |
| 4,408,284 | 10/1983 | Kijesky et al. | 364/724 |
| 4,416,179 | 11/1983 | Wachi | 364/724 |

*Primary Examiner*—James D. Thomas
*Assistant Examiner*—Dale M. Shaw
*Attorney, Agent, or Firm*—Donald J. Lenkszus

[57] ABSTRACT

Such digital filters process digital input data occurring during short pulses of a filter sampling signal (fa) in the pure binary code and in two's complement notation. They contain a parallel-to-serial converter (pw) at the input end, at least one adder (ad), at least one shift register used as a status register (z), at least one multiplier circuit (m1) to which an input-data-dependent signal and a factor which is constant at least during the multiplication are applied as a multiplier and a multiplicand, respectively, and a serial-to-parallel converter (sw) at the output end. The status register (z) has, in addition to a number of stages determined by the number of digits of the input data, a number of stages equal to the number of digits of the multiplicand. The parallel-to-serial converter (pw) is followed by a digit complementer (se) which increases the number of digits of the output signal of the parallel-to-serial converter (pw) to that of the status register (z). The function of the multiplier circuit is implemented with a sign-signal repeater (vw) and a tap on at least one stage (r) of the status register (z) which tap is connected to the input of the sign-signal repeater (vw). Associated with the outputs of the digit complementer (se), the status register (z), and the sign-signal repeater (vw) are the inputs of the adder (ad) and the subtracter (s), or vice versa.

Particularly advantageous circuit structures for the stages of the above-mentioned subcircuits are provided for implementation in ratio-type dynamic insulated-gate field-effect transistor technology using a two-phase clock system.

16 Claims, 14 Drawing Figures

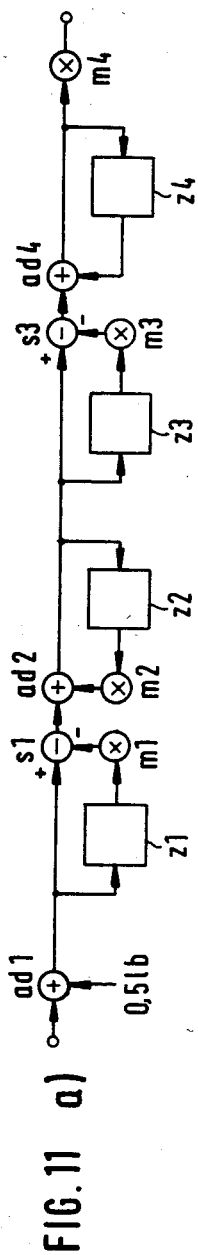
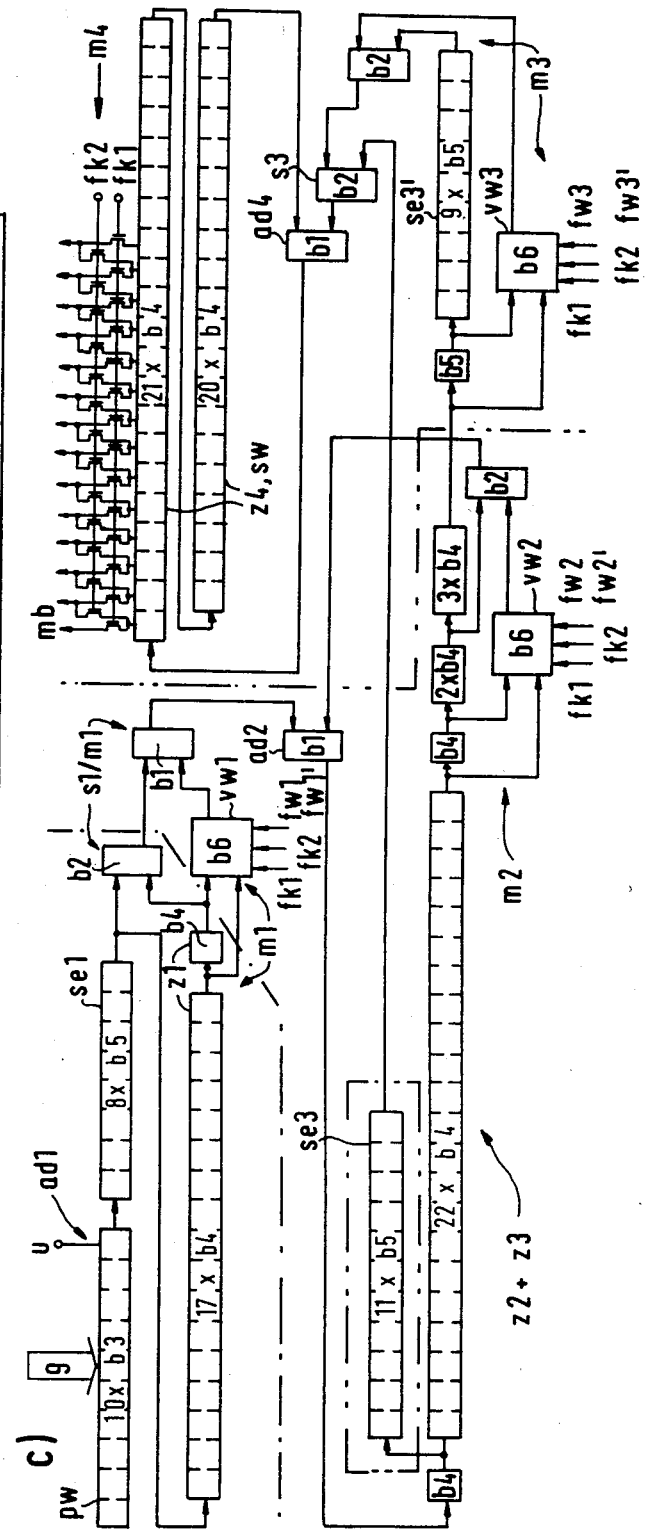
FIG. 11 a), b), c)

4,569,031

CIRCUIT ARRANGEMENT FOR SERIAL DIGITAL FILTERS

BACKGROUND OF THE INVENTION

The present invention relates to a circuit arrangement for digital filters by which digital input signals occurring in the pure binary code and in two's complement notation during short pulses of a filter sampling signal are processed in serial form, and which contain a parallel-to-serial converter at the input end, at least one adder, at least one shift register used as a status register, at least one multiplier circuit to which an input-data-dependent signal and a factor which is constant at least during the multiplication are applied as the multiplier and the multiplicand, respectively, and a serial-to-parallel converter at the output end.

In a book by S. A. Azizi "Entwurf und Realisierung digitaler Filter", Munich, 1981, it is mentioned on pages 288/89 that digital filter can be realized as circuits (called "hardware realization" there) which process the input signals in serial form, and that the individual subcircuits of the digital filter are then suitable serial arrangements, i.e., serial multipliers, serial adders, etc. It is also stated that this mode of operation requires, in addition to the filter sampling signal, a further sampling signal, referred to as "bit clock" there, whose repetition rate may be much higher than that of the word clock depending on the word length of the output variables and coefficients.

SUMMARY OF THE INVENTION

One object of the invention is to provide a basic circuit for serial digital filters whose subcircuits are combinable, particularly in multiple arrangements, depending on the type of filter to be implemented. A further object of the invention is to provide particularly advantageous basic circuits for the individual subcircuits of such a digital filter which can be integrated in ratio-type field-effect transistor technology using a two-phase clock system.

An advantage offered by the invention is that the implementation of the multiplier function in the manner claimed and the one-stage design of the adder and the subtracter eliminate carry formation times during signal processing, as are usually required in multidigit adders, subtracters, and multipliers. The processing speed of the digital filters according to the invention is determined only by the word width of the digital input data to be processed and, among other things, by the accuracy-dependent word width of the output signal.

BRIEF DESCRIPTION OF THE DRAWING

The invention will now be explained in greater detail with reference to the accompanying drawings, in which:

FIG. 11a and 11c shows an embodiment of a digital filter with four status registers, with 11B showing the numerical values used by the multipliers (m1–m4) in FIGS. 11a and 11b.

DETAILED DESCRIPTION

Figure 1:
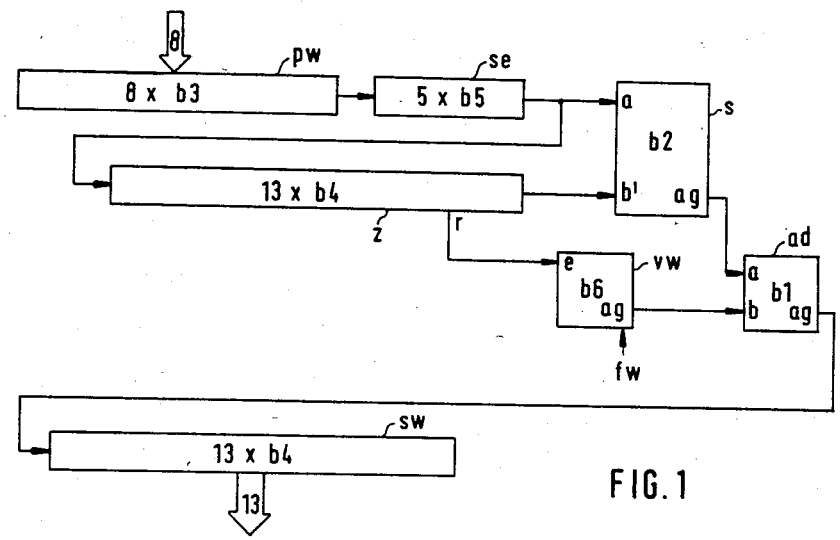
FIG. 1 is a block diagram of an embodiment of the basic digital filter circuit according to the invention.

The embodiment of FIG. 1 shows schematically the design of a simple first-order digital filter to which eight-digit input data are applied. These input data may come, for example, from an analog-to-digital converter or from digitial signal processors or corresponding subcircuits. The way in which the digital input data applied to the digital filter are generated does not form part of the present invention.

Figure 10:
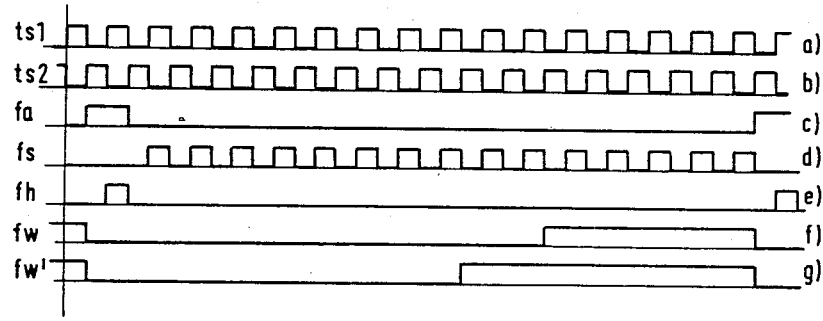
FIG. 10 is a timing diagram of the clock signals to be applied in the arrangements of FIGS. 1 to 8.

The input data are transferred, at the repetition rate of the filter sampling signal fa (see FIG. 10c), into the parallel-to-serial converter pw, whose serial output is connected to the input of the digit complementer se. The latter has its output coupled to the input of the status register z and to the minuend input a of the subtracter s. The output of the status register z is connected to the subtrahend input b' of the subtracter s, which has its output ag coupled to the first input a of the adder ad.

The status register z has, in addition to the number of states determined by the number of digits of the input data—eight stages in FIG. 1—, a number of stages which is equal to the number of digits of the multiplicand. The status register z of FIG. 1 thus has thirteen stages. Because parallel to serial converter pw is only 8 digits wide wherein the status register has 13 stages, a buffer circuit se having five stages is provided so that the combination of the parallel to serial converter pw and the buffer circuit se provides 13 digits to register z. Functionally the buffer circuit se is a 5 digit buffer register. The input e of the sign-signal repeater vw is connected to the output of one of the stages of the status register z located close the output; the number r of this stage, counted from the output to the left, determines the multiplier in the form $1-2^{-r}$. The output ag of the sign-signal repeater vw is connected to the second input b of the adder ad, which has its output ag coupled to the serial input of the serial-to-parallel converter sw. The latter, like the status register z, has thirteen stages in the embodiment of FIG. 1, because the output signal of this digital filter has thirteen digits which are delivered at the filter output in parallel form. The embodiment of FIG. 2 differs from that of FIG. 1 only in that the sign-signal repeater vw has not only one input e as in FIG. 1, but n inputs e1, which are connected to additional stages of the status register z. This permits different time constants of the digital filter to be set by suitably switching to one of the other inputs en.

Depending on the type of filter to be implemented, the subtracter s and the adder ad may be interchanged or the digital filter may include two or more adders or subtracters; this is not shown in the drawings for the sake of simplicity. The output of the last adder or subtracter in the direction of signal flow need not necessarily be connected to the serial-to-parallel converter sw, but an additional status register may be provided there, as will be described below with the aid of FIG. 11.

In the invention, the function of the multiplier circuit of the prior art arrangement is realized with the sign-signal repeater vw in conjunction with the taps on stages of the status register z. It should be pointed out that the way in which taps are chosen on status-register stages lying in front of the output applies to multipliers smaller than one. Such multipliers generally occur in recursive digital filters, because in such filters, multipliers greater than one would lead to oscillations. In nonrecursive digital filters, however, multipliers may occur which are greater than one. The multiplier then usually has digits located to the left and to the right of the point, the digits to the right of the point requiring taps as shown in FIGS. 1 and 2, i.e., in the direction of the input f the status register z, while the digits to the left of the point necessitate further stages of the status register z and taps on these further stages.

Figure 2:
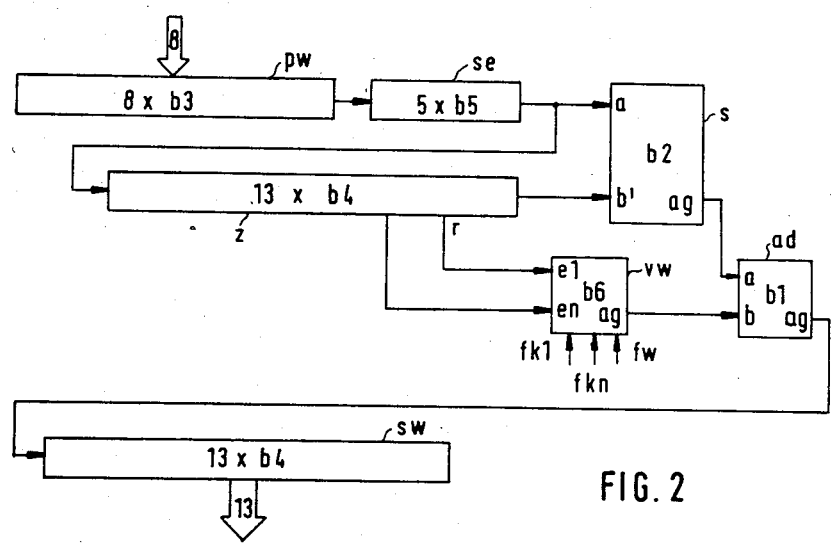
FIG. 2 is a block diagram of an embodiment derived from FIG. 1 in which two filter time constants are settable.

In FIGS. 1 and 2, the number of stages and the type of subcircuit are given in the blocks representing the subcircuits, which will be described in more detail with the aid of FIGS. 3 to 8. The parallel-to-serial converter pw consists of eight stages b3; the digit complementer consists of five stages b5, and the status register z and the serial-to-parallel converter sw each consist of thirteen stages b4. To permit a better distinction, the adder ad, the subtracter s, and the sign-signal repeater vw have been provided with "stage" designations, too: they may be regarded as stage b1, stage b2, and stage b6, respectively.

Figure 3:
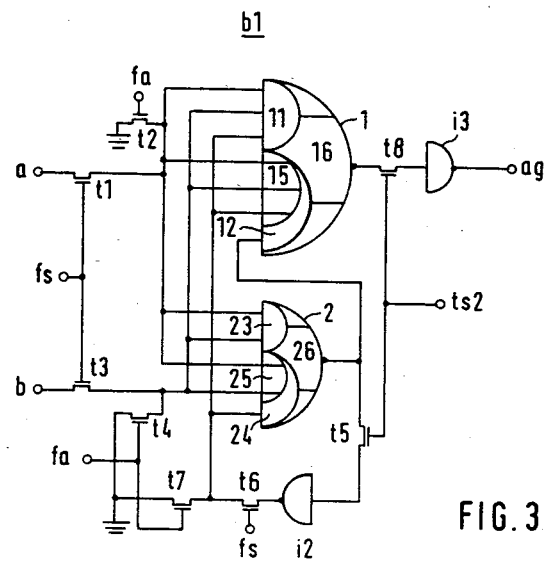
FIGS. 3 to 8 are partly schematic circuit diagrams illustrating the implementation of the individual circuits of FIGS. 1 and 2 in ratio-type insulated-gate field-effect transistor technology using a two-phase clock system, with FIG. 3 showing the adder, FIG. 4 showing the subtracter, FIG. 5 showing the parallel-to-serial converter, FIG. 6 showing the status register, FIG. 7 showing the buffer, and FIG. 8 showing the sign-signal repeater.

FIG. 3 shows a partly schematic circuit diagram of stage b1, i.e., the adder ad.

Figure 4:
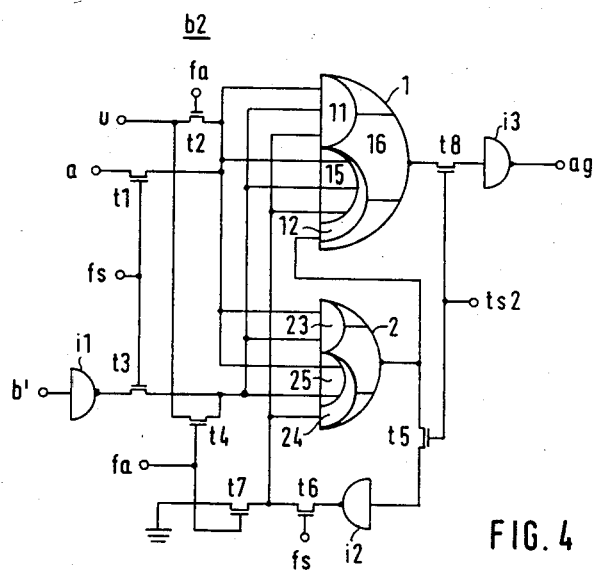

In the representation of FIGS. 3 and 4, only those logic gates have a load resistor of their own where a dot, commonly used to indicate that inversion occurs, has been placed at the output point of the logic symbol. Therefore, a distinction will be made between a "gate", which is a logic circuit with a single load resistor, and a "logic element" as such, which is only part of a gate and has no separate load resistor. This applies to the realization using insulated-gate field-effect transistor technology, as is assumed in FIGS. 3 and 4.

Stage b1 consists of the first and second complex gates 1, 2 and the subcircuits mentioned below. The first complex gate 1 consists of the first, three-input AND element 11, the first, three-input OR element 15, the second, two-input AND element 12, and the first, two-input NOR element 16. The outputs of the AND elements 11, 12 are each connected to one of the two inputs of the first NOR element 16, and the output of the first OR element 15 is connected to the first input of the second AND element 12.

The second complex gate 2 consists of the third, two-input AND element 23, the second, two-input OR element 25, the fourth, two-input AND element 24, and the second, two-input NOR element 26. The outputs of the AND elements 23, 24 are each connected to one input of the second NOR element 26, and the output of the second OR element 25 is connected to the first input of the fourth AND element 24.

The first inputs of the first and second AND elements 11, 23 and of the first and second OR elements 15, 25 are connected to the first signal input a through the channel of the first transistor t1, and grounded through the channel of the second transistor t2. The second inputs of the first and third AND elements 11, 23 and of the first and second OR elements 15, 25 are connected to the second signal input b through the channel of the third transistor t3, and grounded through the channel of the fourth transistor t4.

The second input of the second AND element 12 is connected to the output of the second complex gate 2, which output is also connected via the channel of the fifth transistor t5, the second inverter i2, and the channel of the sixth transistor t6—in this order—to the second input of the fourth AND element 24 and to the third inputs of the first AND element 11 and the first OR element 15. The last-mentioned three inputs are also grounded through the channel of the seventh transistor t7.

The output of the first complex gate 1 is connected to the output ag of the adder ad through the channel of the eighth transistor t8 and the third inverter i3. The second two-phase clock signal ts2 is applied to the gates of the fifth and eighth transistors t5, t8; the filter sampling signal fa is applied to the gates of the second, fourth, and seventh transistors t2, t4, t7, and the data shift signal fs is applied to the gates of the first, third, and sixth transistors t1, t3 t6. The waveforms of these signals are shown in FIGS. 10b, c, and d, with FIG. 10a illustrating the shape of the first two-phase clock signal ts1.

In this connection it should be pointed out that the two two-phase clock signals ts1, ts2 are square-wave, equal-frequency signals related to ground, with the pulses of one of the signals lying in the intervals between the pulses of the other signal and vice versa, i.e., the two signals do not overlap. In general, the two signals have a 1:1 mark/space ratio. As can be seen in FIGS. 10a and d, the data shift signal fs is equal in frequency and phase to the first two-phase clock signal ts1, and it begins with the first leading edge of the signal ts1 that occurs after the trailing edge of the filter sampling signal fa. The maximum pulse width of th latter signal is equal to the period of the clock signals ts1, ts2, and its leading edge coincides with one of the leading edges of the second clock signal ts2. The pulses of the data shift signal fs cease at the leading edge of the next pulse of the filter sampling signal.

FIG. 4 shows a partly schematic circuit diagram of stage b2, i.e., the subtracter s. Except for a few details, this circuit is identical to the adder circuit of FIG. 3. It differs from that circuit in that the second and fourth transistors t2, t4 each have one end connected to the supply voltage u rather than to ground as in FIG. 3. Furthermore, the channel of the third transistor t3 is preceded by the first inverter i1, so that the subtrahend input b' is connected to the third transistor t3 only via this inverter i1, while in FIG. 3 the second signal input b of the adder ad is connected directly to the channel of the third transistor t3.

Figure 5:
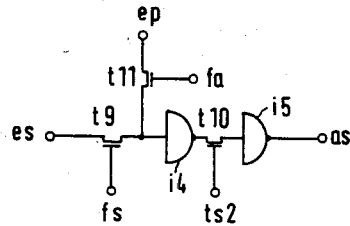
Figure 6:
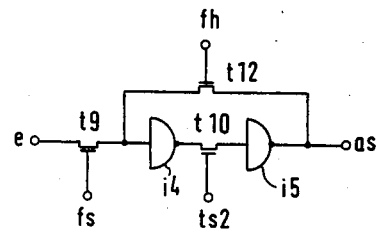
Figure 7:
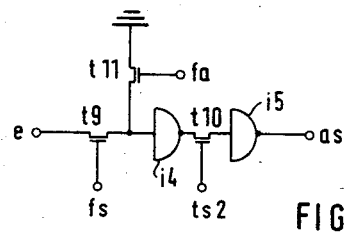

FIGS. 5, 6, and 7 show the stages b3, b4, and b5, i.e., a stage of the parallel-to-serial converter pw, the status register z or the serial-to-parallel converter sw, and the digit complementer se. These three stages are identical as far as the series arrangement of the transistors and inverters between the input e, es and the serial output as is concerned, and differ only in the remaining circuitry. The series arrangement, as seen from the input e, es, consists of the channel of the ninth transistor t9, the fourth inverter i4, the channel of the tenth transistor t10, and the fifth inverter i5, and represents a two-phase ratio-type dynamic shift-register stage, i.e., a one-bit delay stage.

In stage b3, shown in FIG. 5, the input of the fourth inverter i4 is connected via the channel of the eleventh transistor t11 to the parallel input ep, through which the signal of the respective digit of the input data word is entered into this stage at the repetition rate of the filter sampling signal fa; the signal fa is applied to the gate of the eleventh transistor t11. The data shift signal fs is applied to the gate of the ninth transistor t9, and the second two-phase signal ts2 is applied to the gate of the tenth transistor t10 (see FIG. 10).

Stage b4, shown in FIG. 6, differs from stage b3 in that the channel of the twelfth transistor t12 is connected between the input of the inverter i4 and the serial output as and, thus, the output of the fifth inverter i5. The gate of the twelfth transistor t12 is fed with the data hold signal fh, whose shape is shown in FIG. 10e. It differs from the data shift signal fs of FIG. 10d in that the shifting and holding functions are inverse. From FIG. 10e it is also apparent that the pulses of the data hold signal fh occur only during the pulses of the filter sampling signal fa. This applies only if the fa-period is is completely filled by a filter cycle.

Stage b5, shown in FIG. 7, differs from stage b3 in that the parallel input ep is permanently grounded and, consequently, is at the more negative level, L, of the two logic levels H, L. In this connection it should be mentioned that the embodiments of FIGS. 3 to 8 and 11 are assumed to be implemented with n-channel enhancement-mode transistors, so that the clock and data signals are assigned to positive logic.

Figure 8:
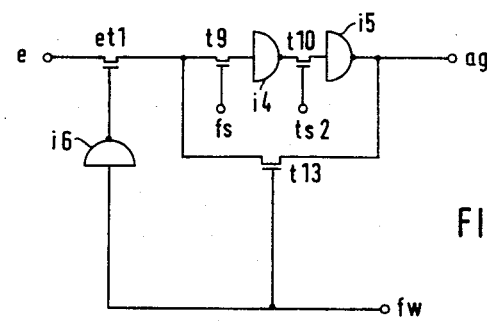

In the circuit of stage b6, shown in FIG. 8, the channel of the first input transistor et1 and the series arrangement of the subcircuits t9, i4, t10, and i5 (also present in FIGS. 5 to 7), i.e., a one-bit delay stage, are inserted between the input e and the output ag. The node of the input transistor et1 and the ninth transistor t9 is connected to the output ag and, thus, to the output of the fifth inverter i5 through the channel of the thirteenth transistor t13. The sign repeat signal fw is applied to the gate of this transistor t13 and, through the sixth inverter i6, to the gate of the input transistor et1. It is shown in FIG. 10f for the embodiment of FIG. 1; it is at a H level during those fixed pulses of the data shift signal fs of FIG. 10d whose number is equal to the number of stages from the end of the status register z to the tap connected to the input of the sign-signal repeater vw (FIG. 1), provided that this tap is at the fifth last stage, so that the above H level of the sign repeat signal fw is present during the last five pulses of the data shift signal fs.

Figure 9:
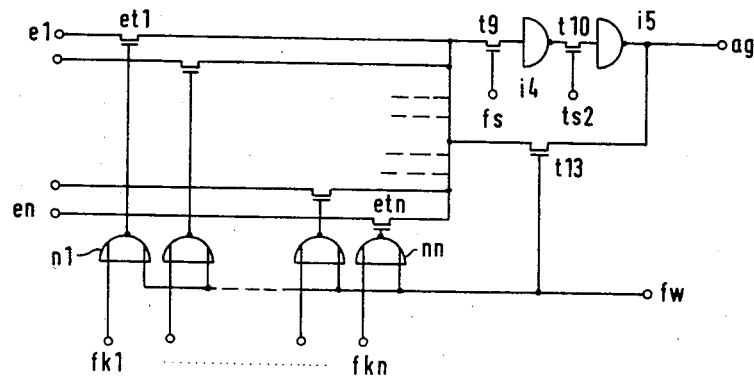
FIG. 9 is a schematic circuit diagram of a sign-signal repeater allowing the selection of n time constants of the digital filter.

FIG. 9 shows an expansion of stage b6 of FIG. 8 if the characteristic of the serial digital filter according to the invention is to be switchable. The sign-signal repeater vw then has the inputs e1 . . . en, between each of which and the ninth transistor t9 an input transistor et1, etn is connected. Instead of from the sixth inverter i6 of FIG. 8, the gate of each of the input transistors et1, etn is driven from a two-input NOR gate n1, nn, whose first and second inputs are fed with the sign repeat signal fw and one of n filter constant selection signals fk1, fkn.

As mentioned above, FIG. 2 shows that the sign-signal repeater vw has two inputs connected to two taps on the status register z. FIG. 10g shows the sign repeat signal fw', which is assigned to the second tap and whose H level lasts two data shift clock periods longer than the sign repeat signal fw of FIG. 10f, because the second tap is located two stages to the left of the first tap r.

FIG. 11 shows the application of the principles underlying the invention to a multistage digital filter containing a total of four status registers z1, z2, z3, z4, which are connected with the four multiplier circuits m1, m2, m3, m4, the three adders ad1, ad2, ad4, and the two subtracters s1, s3 in the manner shown schematically in FIG. 11a. It can be seen that the filter stages designated by the reference numerals 1 and 3 are non-recursive digital filters, while the filter stages designated by the reference numerals 2 and 4 are recursive digital filters. By means of the adder ad1, a constant value equal to half the value of the least significant bit lb is added to the input signal. Similarly, the multiplier circuit m4 ahead of the filter output multiplies the signal by a constant factor.

The table of FIG. 11b gives for the circuit of FIG. 11c the numerical value by which the multiplier circuits m1 . . . m4 multiply the respective signal. It is readily apparent that, in the present example, these multipliers are all smaller than one. It can also be seen from the table of FIG. 11b that the filter shown in FIGS. 11a and 11c is switchable to sets of multipliers designated by "Option I" and "Option II". Each of the two options is assigned the special signals given at the end of the table.

For the schematic circuit diagram of FIG. 11c it is assumed that the input data consist of 9 bits (cf. the digit 9 in the stripe-like input arrow), so that in this case, taking into account the 0.5-lb addition, the parallel-to-serial converter pw has ten stages b3. It is assumed that the input data with the most significant bit mb are so entered that this bit is placed in the leftmost stage. The aforementioned addition of 0.5 lb is accomplished by applying the supply voltage u to the input of the tenth stage from the left. The status register z1 has eighteen stages b4, so that the buffer circuit se1 has eight stages b5. In the case of Option I, the multiplier m1 has the value $1-2^1$, so that the output of the status register z1 is connected directly to the appropriate input of the sign-signal repeater vw1. The tap assigned to the multiplier m1 of Option II with the value $1-2^{-2}$ is located one stage b4 before the output of the status register z1. The multiplier circuit m1 is thus implemented with these two taps.

The function of the subtracter s1 and part of the function of the multiplier circuit m1 are realized by the special arrangement of stage b2 at the output of the buffer circuit se1, and of stage b1 at the output of this stage b2 and of the sign-signal repeater vw1. The output from stage b1 is thus applied to the adder ad2.

The special realization of s1, m1 follows from the fact that the subtraction $-(1-2^{-r})$ is performed as an addition $+(2^{-r}-1)$.

The two status registers z2, z3 in the second-lowest line of FIG. 11c are both shown to consist of stages b4; 29 such stages are provided. The remainder of the function of the multiplier circuit m2 is realized with the sign-signal repeater vw2 and the stage b2, which has its subtrahend input connected to the sign-signal repeater vw2, while its minuend input is connected to the tap before the third last stage of the status registers z2+z3. The output of stage b2 is coupled to the other input of the adder ad2.

The output of the first stage b4 of the status register z2+z3 is connected to the input of the buffer circuit se3, which consists of eleven stages b5 and has its output coupled to the subtrahend input of the subtracter s3.

The minuend input of the latter is connected to the output of an additional subtracter stage b2, which, together with the sign-signal repeater vw3 and the taps to which its two inputs are connected, realizes the function of the multiplier circuit m3. Also provided for this purpose is the additional digit complementer se3' with ten stages b5, the tap of the first stage b5 being connected to one of the two inputs of the sign-signal repeater vw3, whose second input is connected to a terminal ahead of this stage b5 and, thus, to the output of the status register z2+z3. The output of the digit complementer se3' is coupled to the subtrahend input of the additional subtracter b2, whose minuend input is connected to the output of the sign-signal repeater vw3.

The output of the subtracter s3 is connected to one input of the adder ad4, which has its output coupled to the input of the serial-to-parallel converter sw. The latter has a total of forty-one stages b4, and its serial output is connected to the other input of the fourth adder ad4. The function of the multiplier circuit m4 is realized by taking the signal from the first fourteen stages by means of the transistors shown. The two Options I, II are made by switching the outputs between adjacent stages by means of the additional transistors, as shown.

The subcircuits associated with the status register z1 are separated from the other subcircuits in FIG. 11c by a dash-and-dot line. The subcircuits at the upper left of the dash-and-dot line are clocked by the data shift signal fs1, shown in FIG. 12c, and the data hold signal fh1 shown in FIG. 12d.

The subcircuits lying on the right-hand side and the buffer circuit se3 are separated from the other subcircuits by a dash-and-double-dot line, which is to indicate that these subcircuits are clocked by the data shift signal fs3 shown in FIG. 12g, and the data hold signal fh3 shown in FIG. 12h.

FIGS. 12i to 12p show the sign repeat signals fw1, fw1'; fw2, fw2'; fw3, fw3', which are assigned to the three sign-signal repeaters vw1, vw2, vw3. FIGS. 12e and 12f show the data shift signal fs2 and the data hold signal fh2, which are applied to the subcircuits lying between the dash-and-dot line and the dash-and-double-dot line.

Figure 12:
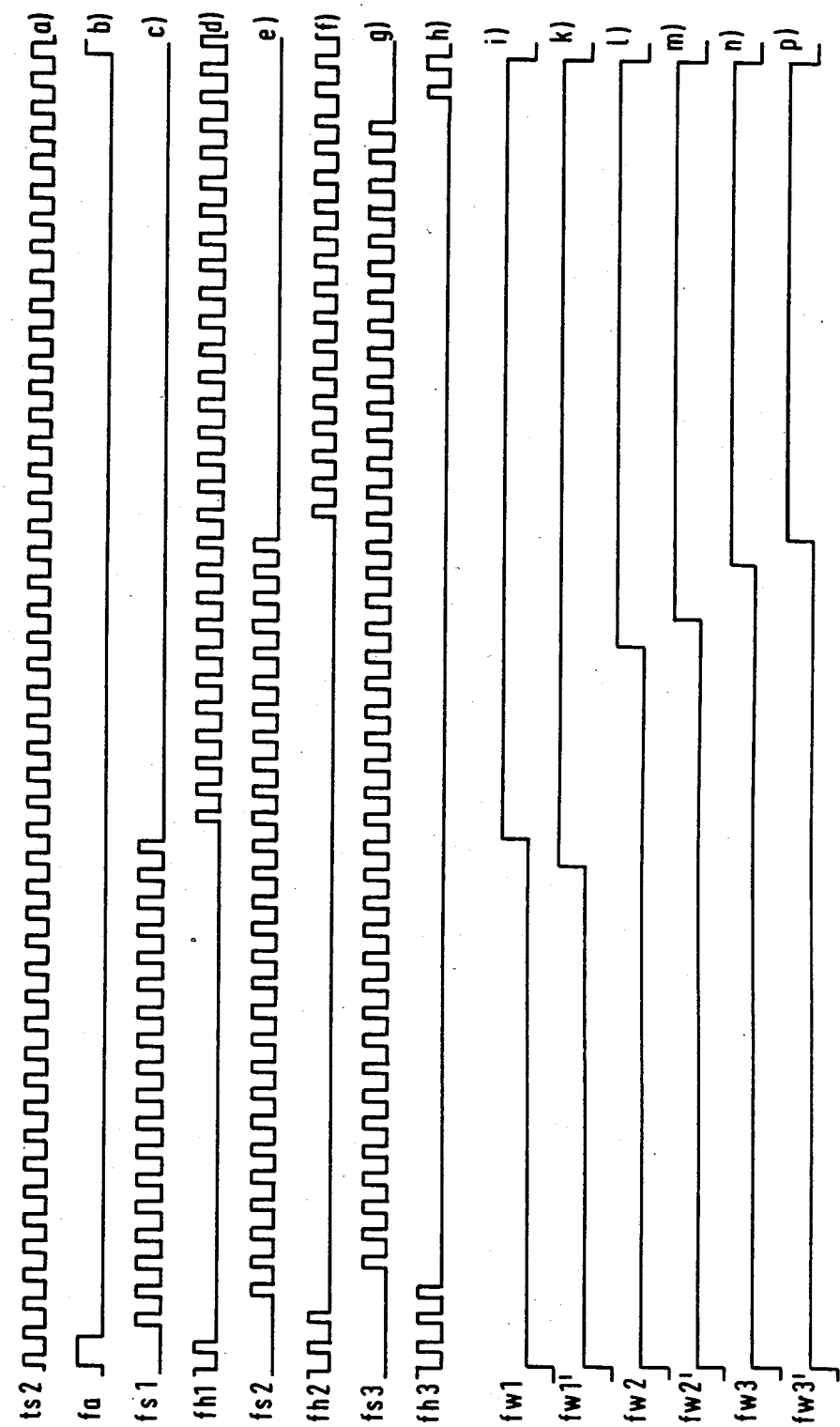
FIG. 12 shows the clock signals to be applied in the embodiment of FIG. 11.

The timing diagram of FIG. 12 shows that the data hold signals fh1, fh2, fh3 may also have H levels outside the pulses of the filter sampling signal fa; this follows in each practical case from the specially implemented filter characteristic and function.

As can be seen from FIG. 11c, arbitrary digital filter circuits can be realized with the six stages b1 . . . b6 of FIGS. 3 to 8. The use of these six stages results in an advantageous layout of such an integrated circuit, which is made possible by the nearly identical cell structure of, on the one hand, the stages b3 to b6 and, on the other hand, the stages b1 and b2. After the filter type to be realized and its characteristics have been determined numerically with the aid of the book mentioned at the beginning, the invention offers an advantageous means of realizing the circuit for the calculated filter type.

As indicated above, the circuit will advantageously be realized using n-channel enhancement-mode insulated-gate field-effect transistors, the inverters being advantageously depletion-load inverters. In case of need it is also possible to use p-channel enhancement-mode transistors, in which case enhancement-load transistors are advantageously employed.

It should be added that in FIG. 11c the forty-one stages b4 for the status register z4 are also the stages for the serial-to-parallel converter sw.

I claim:

1. A digital filter for serially processing digital input signals in pure binary code and in two's complement notation occurring during short pulses of a filter sampling signal, said filter comprising:

a parallel to serial converter having inputs receiving said digital input signals, said parallel to serial converter including a first plurality of stages equal in number to the number of digits of input data represented by said input signal;

a status register comprising a shift register having a second plurality of stages the number of which being determined by said number of digits of input data and a predetermined number;

a buffer circuit having a serial input coupled to the output of said parallel to serial converter and having a serial output coupled to the serial input of said status register, said buffer circuit having a number of stages equal to said predetermined number;

a sign signal repeater circuit having an input coupled to a predetermined one stage of said status register;

a subtracter having one input coupled to said serial output of said buffer circuit, and a second input coupled to the serial output of said status register;

at least one adder having a first input coupled to the output of said subtracter and a second input coupled to the output of said sign signal repeater circuit; and a serial to parallel converter coupled to the output of said adder.

2. A digital filter in accordance with claim 1 implemented with ratio-type dynamic integrated field-effect transistor technology using a two phase clock system.

3. A digital filter in accordance with claim 1 wherein said at least one adder comprises:

a first complex gate including a first three-input AND element, a first three-input OR element, a second two-input AND element, and a first two-input NOR element, with the outputs of said first and second AND elements each connected to one input of said first NOR element and the output of said first OR element connected to the first input of said second AND element;

a second complex gate including a third two-input AND element, a second two-input OR element, a fourth two-input AND element, and a second two-input NOR element, with the outputs of said third and fourth AND elements each connected to one input of said second NOR element, and the output of said second OR element connected to the first input of said fourth AND element;

a first transistor having its channel connecting the first inputs of said first and third AND elements and of said first and second OR elements to said first adder input;

a second transistor having its channel connecting said first inputs to ground;

a third transistor having its channel connecting the second inputs of said first and third AND elements and of the first and second OR elements to said second adder input;

a fourth transistor having its channel connecting said second inputs to ground;

a second input of said second AND element being connected to the output of said second complex gate;

a fifth transistor having its channel connected to said second complex gate output;

a second inverter having its input coupled to said fifth transistor channel;

a sixth transistor having its channel connected between said second inverter output and the second input of said fourth AND element and to the third inputs of said first AND element and said first OR element;

a seventh transistor having its channel connected to ground and to said fourth AND element second input and said third inputs of said first AND and first OR elements;

an eighth transistor having its channel connected to said first complex gate output;

a third inverter coupling said eighth transistor channel to the output of said adder;

the gates of said fifth and eighth transistors receiving a second two-phase clock signal;

the gates of said second, fourth and seventh transistors receiving said filter sampling signal; and the gates of said first, third, and sixth transistors receiving a data shift signal.

4. A digital filter in accordance with claim 1 wherein each stage of said parallel to serial converter comprises:

a one bit delay stage having a serial input and a serial output, a ninth transistor having its channel connected to said serial input, a fourth inverter having its input connected to said ninth transistor channel, a tenth transistor having its channel connected to said fourth inverter output and a fifth inverter having its input connected to said tenth transistor channel and its output connected to said serial output, an eleventh transistor having its channel connected between said fourth inverter input and a parallel input;

the gate of said ninth transistor receives a data shift signal;

the gate of said tenth transistor receives a second two phase clock signal; and the gate of said eleventh transistors receivers said filter sampling signal.

5. A digital filter in accordance with claim 1 wherein each stage of said serial to parallel converter and said status register comprises:

a one bit delay stage having a serial input and a serial output, a ninth transistor having its channel connected to said serial input, a fourth inverter having its input connected to said ninth transistor channel, a tenth transistor having its channel connected to said fourth inverter output and a fifth inverter having its input connected to said tenth transistor channel and its output connected to said serial output, a twelfth transistor having its channel connected between said fourth inverter input and said serial output;

the gate of said ninth transistor receives a data shift signal;

the gate of said tenth transistor receives a second two phase clock signal; and the gate of said twelfth transistor receives or data hold signal.

6. A digital filter in accordance with claim 1 wherein each stage of said buffer circuit comprises:

a one bit delay stage having a serial input and a serial output, a ninth transistor having its channel connected to said serial input, a fourth inverter having its input connected to said ninth transistor channel, a tenth transistor having its channel connected to said fourth inverter output and a fifth inverter having its input connected to said tenth transistor channel and its output connected to said serial output, an eleventh transistor having its channel connected between said fourth inverter input and ground;

the gate of said ninth transistor receives a data shift signal;

the gate of said tenth transistor receives a second two phase clock signal; and the gate of said eleventh transistors receives said filter sampling signal.

7. A digital filter in accordance with claim 1 wherein said sign signal repeater comprises:

a first input;

a first output;

a one bit delay circuit including a first transistor having its channel connected to said first input, a ninth transistor having its channel connected to said first transistor channel, a fourth inverter having its input connected to said ninth transistor channel, a tenth transistor having its channel connected to said fourth inverter output, and a fifth inverter having its input connected to said tenth transistor channel and having its output connected to said first output;

a thirteenth transistor having its channel connected to the node between the channels of said first and ninth transistors and to said first output;

a sixth inverter having its output coupled to the gate of said first transistor;

the input of said sixth inverter and the gate of said thirteenth transistor receiving a sign repent signal;

the gate of said ninth transistor receiving a data shift signal; and the gate of said tenth transistor receiving a second two phase clock signal.

8. A digital filter in accordance with claim 7 wherein said sign signal repeater comprises:

a plurality of input transistors each having its channel connected at one end to the output of a corresponding stage of said status register, the other ends all channels of said plurality of input transistors being connected to a common node;

a ninth transistor having its channel connected to said common node and having its gate receiving a data shift signal;

a fourth inverter having its input connected to said ninth transistor channel;

a tenth transistor having its channel connected to the output of said fourth inverter and having its gate receiving a second two phase clock signal;

a fifth inverter having its input connected to said tenth transistor channel and its output connected to said sign signal repeater output;

a plurality of two input NOR gates each having its output connected to the gate of a corresponding one of said plurality of input transistors, one input of each of said two input NOR gates receiving a sign repeat signal and each of the other of said two inputs of said plurality of two input NOR gates receiving one of a plurality of filter constant selection signals; and a thirteenth transistor having its channel connected between said common node and said sign signal repeater output and having its gate receiving said sign repeat signal.

9. A digital filter for serially processing digital input signals in pure binary code and in two's complement notation occurring during short pulses of a filter sampling signal, said filter comprising:

a parallel to serial converter having inputs receiving said digital input signals, said parallel to serial converter including a first plurality of stages equal in number to the number of digits of input data represented by said input signal;

a status register comprising a shift register having a second plurality of stages the number of which being determined by said number of digits of input data and a predetermined number;

a buffer circuit having a serial input coupled to the output of said parallel to serial converter and having a serial output coupled to the serial input of said status register, said buffer circuit having a number of stages equal to said predetermined number;

a sign signal repeater circuit having an input coupled to a predetermined one stage of said status register;

an adder having one input coupled to said serial output of said buffer circuit, and a second input coupled to the serial output of said status register;

a subtracter having a first input coupled to the output of said adder and a second input coupled to the output of said sign signal repeater circuit; and a serial to parallel converter coupled to the output of said subtracter.

10. A digital filter in accordance with claim 9 implemented with ratio-type dynamic integrated field-effect transistor technology using a two phase clock system.

11. A digital filter in accordance with claim 9 wherein said at least one adder comprises:

a first complex gate including a first three-input AND element, a first three-input OR element, a second two-input AND element, and a first two-input NOR element, with the outputs of said first and second AND elements each connected to one input of said first NOR element, and the output of said first OR element connected to the first input of said second AND element;

a second complex gate including a third two-input AND element, a second two-input OR element, a fourth two-input AND element, and a second two-input NOR element, with the outputs of said third and fourth AND elements each connected to one input of said second NOR element, and the output of said second OR element connected to the first input of said fourth AND element;

a first transistor having its channel connecting the first inputs of said first and third AND elements and of said first and second OR elements to said first adder input;

a second transistor having its channel connecting said first inputs to ground;

a third transistor having its channel connecting the second inputs of said first and third AND elements and of the first and second OR elements to said second adder input;

a fourth transistor having its channel connecting said second inputs to ground;

a second input of said second AND element being connected to the output of said second complex gate;

a fifth transistor having its channel connected to said second complex gate output;

a second inverter having its input coupled to said fifth transistor channel;

a sixth transistor having its channel connected between said second inverter output and the second input of said fourth AND element and to the third inputs of said first AND element and said first OR element;

a seventh transistor having its channel connected to ground and to said fourth AND element second input and said third inputs of said first AND and first OR elements;

an eighth transistor having its channel connected to said first complex gate output;

a third inverter coupling said eighth transistor channel to the output of said adder;

the gates of said fifth and eighth transistors receiving a second two-phase clock signal;

the gates of said second, fourth and seventh transistors receiving said filter sampling signal; and the gates of said first, third, and sixth transistors receiving a data shift signal.

12. A digital filter in accordance with claim 9 wherein each stage of said parallel to serial converter comprises:

a one bit delay stage having a serial input and a serial output, a ninth transistor having its channel connected to said serial input, a fourth inverter having its input connected to said ninth transistor channel, a tenth transistor having its channel connected to said fourth inverter output and a fifth inverter having its input connected to said tenth transistor channel and its output connected to said serial output, an eleventh transistor having its channel connected between said fourth inverter input and a parallel input;

the gate of said ninth transistor receives a data shift signal;

the gate of said tenth transistor receives a second two phase clock signal; and the gate of said eleventh transistors receivers said filter sampling signal.

13. A digital filter in accordance with claim 9 wherein each stage of said serial to parallel converter and said status register comprises:

a one bit delay stage having a serial input and a serial output, a ninth transistor having its channel connected to said serial input, a fourth inverter having its input connected to said ninth transistor channel, a tenth transistor having its channel connected to said fourth inverter output and a fifth inverter having its input connected to said tenth transistor channel and its output connected to said serial output, a twelfth transistor having its channel connected between said fourth inverter input and said serial output;

the gate of said ninth transistor receives a data shift signal;

the gate of said tenth transistor receives a second two phase clock signal; and the gate of said twelfth transistor receives or data hold signal.

14. A digital filter in acordance with claim 9 wherein each stage of said buffer circuit comprises:
- a one bit delay stage having a serial input and a serial output, a ninth transistor having its channel connected to said serial input, a fourth inverter having its input connected to said ninth transistor channel, a tenth transistor having its channel connected to said fourth inverter output and a fifth inverter having its input connected to said tenth transistor channel and its output connected to said serial output.
- an eleventh transistor having its channel connected between said fourth inverter input and ground;
- the gate of said ninth transistor receives a data shift signal;
- the gate of said tenth transistor receives a second two phase clock signal; and
- the gate of said eleventh transistors receives said filter sampling signal.

15. A digital filter in accordance with claim 9 wherein said sign signal repeater comprises:
- a first input;
- a first output;
- a one bit delay circuit including a first transistor having its channel connected to said first input, a ninth transistor having its channel connected to said first transistor channel, a fourth inverter having its input connected to said ninth transistor channel, a tenth transistor having its channel connected to said fourth inverter output, and a fifth inverter having its input connected to said tenth transistor channel and having its output connected to said first output;
- a thirteenth transistor having its channel connected to the node between the channels of said first and ninth transistors and to said first output;
- a sixth inverter having its output coupled to the gate of said first transistor;
- the input of said sixth inverter and the gate of said thirteenth transistor receiving a sign repent signal;
- the gate of said ninth transistor receiving a data shift signal; and
- the gate of said tenth transistor receiving a second two phase clock signal.

16. A digital filter in accordance with claim 15 wherein said sign signal repeater comprises:
- a plurality of input transistors each having its channel connected at one end to the output of a corresponding stage of said status register, the other ends all channels of said plurality of input transistors being connected to a common node;
- a ninth transistor having its channel connected to said common node and having its gate receiving a data shift signal;
- a fourth inverter having its input connected to said ninth transistor channel;
- a tenth transistor having its channel connected to the output of said fourth inverter and having its gate receiving a second two phase clock signal;
- a fifth inverter having its input connected to said tenth transistor channel and its output connected to said sign signal repeater output;
- a plurality of two input NOR gates each having its output connected to the gate of a corresponding one of said plurality of input transistors, one input of each of said two input NOR gates receiving a sign repeat signal and each of the other of said two inputs of said plurality of two input NOR gates receiving one of a plurality of filter constant selection signals; and
- a thirteenth transistor having its channel connected between said common node and said sign signal repeater output and having its gate receiving said sign repeat signal.

* * * * *